(12) United States Patent
Tastl et al.

(10) Patent No.: US 11,548,228 B2
(45) Date of Patent: Jan. 10, 2023

(54) SOFT-PROOF OF THREE-DIMENSIONAL (3D) PRINTED PARTS

(71) Applicant: HEWLETT-PACKARD DEVELOPMENT COMPANY, L.P., Spring, TX (US)

(72) Inventors: Ingeborg Tastl, Palo Alto, CA (US); Miguel Angel Lopez Alvarez, Vancouver, WA (US); Morgan T. Schramm, Vancouver, WA (US); Jordi Roca Vila, Sant Cugat del Valles (ES); Matthew A. Shepherd, Vancouver, WA (US)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 0 days.

(21) Appl. No.: 16/606,415

(22) PCT Filed: Jun. 11, 2018

(86) PCT No.: PCT/US2018/036947
§ 371 (c)(1),
(2) Date: Oct. 18, 2019

(87) PCT Pub. No.: WO2019/240762
PCT Pub. Date: Dec. 19, 2019

(65) Prior Publication Data
US 2021/0362424 A1      Nov. 25, 2021

(51) Int. Cl.
*B29C 64/386*       (2017.01)
*B33Y 50/00*        (2015.01)
(Continued)

(52) U.S. Cl.
CPC ............ *B29C 64/386* (2017.08); *B33Y 50/00* (2014.12); *G06F 3/1208* (2013.01);
(Continued)

(58) Field of Classification Search
CPC ..... B29C 64/386; B33Y 50/00; G06F 3/1208; G06F 3/1232; G06F 30/12; G06F 30/20; G06F 3/1256; G06F 3/1285; H04N 1/6011
See application file for complete search history.

(56) References Cited

U.S. PATENT DOCUMENTS 8,537,357 B2    9/2013   Holub et al.
9,104,358 B2    8/2015   Rolleston
(Continued)

FOREIGN PATENT DOCUMENTS

EP          2930694 A2 * 10/2015  ............ G06F 30/00
WO     WO2017152109 A1    9/2017

OTHER PUBLICATIONS

Stratasys J750 Unleash your Imagination with Neverbefore-Seen Multi-Material Capabilities, www.stratasys.com, 2016, pp. 2&3, Stratasys Ltd.

*Primary Examiner* — Chad G Erdman
(74) *Attorney, Agent, or Firm* — Shook, Hardy & Bacon L.L.P.

(57) ABSTRACT

A system for presenting a soft-proof of a three-dimensional (3D) printed part may include a processor, and a memory device communicatively coupled to the processor. The system may also include a communication link to support communication with a 3D printing device, and computer usable program code to, when executed by the processor, retrieve data from the 3D printing device defining at least one capability of the 3D printing device that affects an appearance of a part when printed. The system may also include an application programming interface (API) to pro- (Continued)

vide data defining generation of a soft-proof of the part based on the at least one capability of the 3D printing device, the soft-proof of the part depicting characteristics of the part as the part appears as printed.

20 Claims, 11 Drawing Sheets

(51) Int. Cl.
*G06F 30/20* (2020.01)
*G06F 30/12* (2020.01)
*G06F 3/12* (2006.01)

(52) U.S. Cl.
CPC ............ *G06F 3/1232* (2013.01); *G06F 30/12* (2020.01); *G06F 30/20* (2020.01)

(56) References Cited

U.S. PATENT DOCUMENTS

| | | |
|---|---|---|
| 9,782,936 B2 | 10/2017 | Glunz et al. |
| 2005/0213116 A1 | 9/2005 | Uejo |
| 2007/0206853 A1* | 9/2007 | Kim .................... H04N 1/6088 382/167 |
| 2011/0273731 A1 | 11/2011 | Haikin et al. |
| 2012/0044538 A1 | 2/2012 | Lin et al. |
| 2014/0036283 A1* | 2/2014 | Tastl .................... H04N 1/6013 358/1.9 |
| 2015/0005919 A1 | 1/2015 | Mcgatha et al. |
| 2016/0274830 A1 | 9/2016 | Jang et al. |
| 2016/0375676 A1 | 12/2016 | Ritchie et al. |
| 2017/0374234 A1* | 12/2017 | Leskanic .............. H04N 1/6041 |
| 2018/0018545 A1* | 1/2018 | Tastl .................... G06K 15/026 |

* cited by examiner

SOFT-PROOF OF THREE-DIMENSIONAL (3D) PRINTED PARTS

BACKGROUND

Some additive manufacturing systems produce three-dimensional (3D) objects by building up layers of material and combining those layers using adhesives, heat, chemical reactions, and other coupling processes. Some additive manufacturing systems may be referred to as "3D printers." The additive manufacturing systems make it possible to convert a computer aided design (CAD) model or other digital representation of an object into a physical object. Digital data is processed into slices each defining that part of a layer or layers of build material to be formed into the object.

BRIEF DESCRIPTION OF THE DRAWINGS

The accompanying drawings illustrate various examples of the principles described herein and are part of the specification. The illustrated examples are given merely for illustration, and do not limit the scope of the claims.

Figure 1:
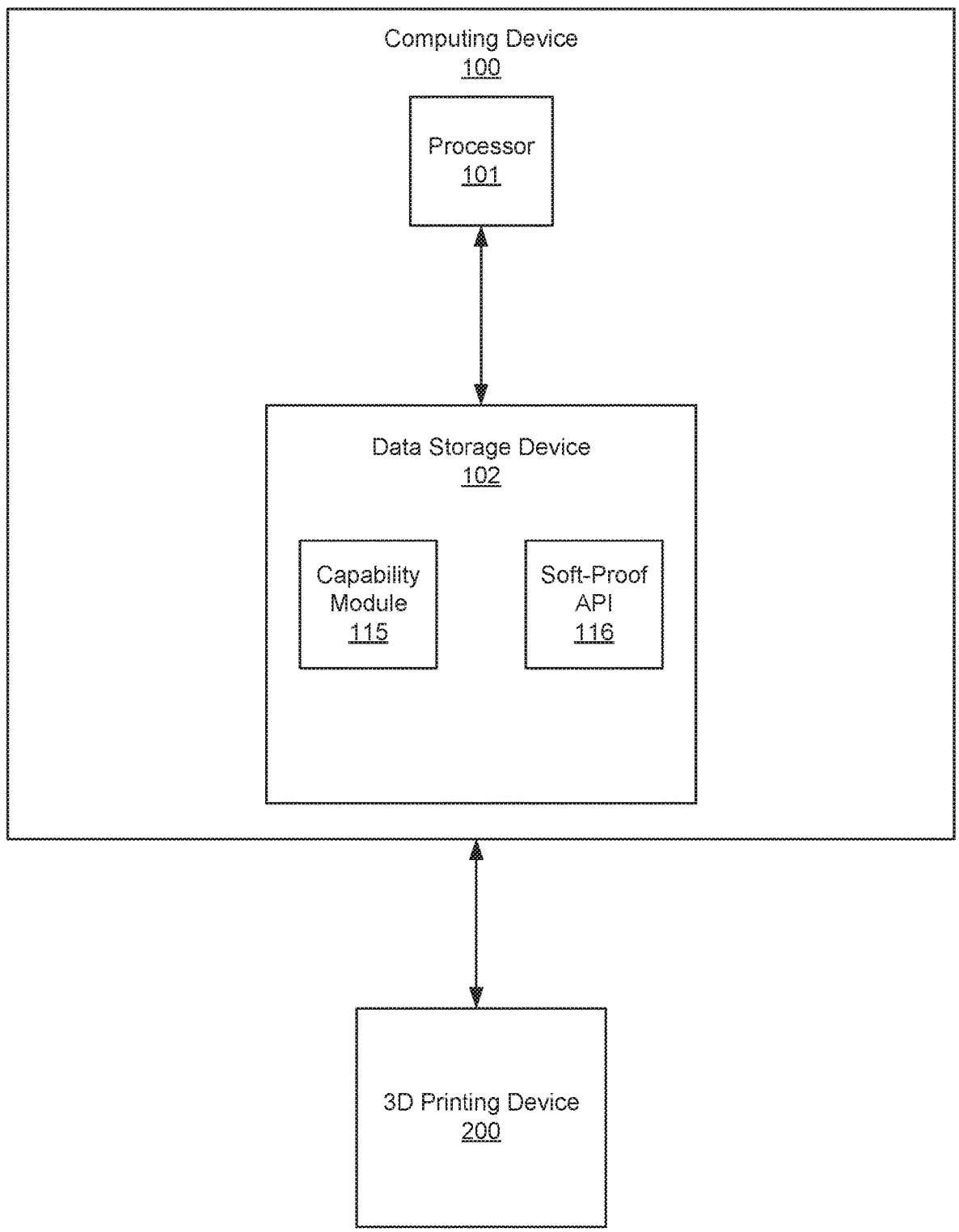
FIG. 1 is a block diagram of a system for presenting a soft-proof of a three-dimensional (3D) printed part, according to an example of the principles described herein.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

As described above, additive manufacturing devices and systems may be used to create objects or parts from CAD model data defining the object or part. Some additive manufacturing devices and systems may create an object that does not necessarily include characteristics expected by a user. This may be especially true when a user utilizes a 3D drafting and modeling computer program such as a CAD application that allows the user to view a part or object as a designed element within a visual workspace. These 3D drafting and modeling computer programs may be used to create object data used as input to an additive manufacturing device for the additive manufacturing device to print, build, or form the part designed by the 3D drafting and modeling computer programs.

However, these 3D drafting and modeling computer programs, through their various visual workspaces, do not depict the part as it may be printed by an additive manufacturing device. This visual workspace may allow for soft-proofing of the part to be printed. Soft-proofing is a preprinting process that utilizes computer programs and hardware such as a display device to check the accuracy of a part before the time and expense associated with the printing of the part is spent. However, the soft-proof of the part, for the reasons described herein, may not accurately depict the part as printed. For example, a 3D drafting and modeling computer program may depict a part using a color such as a vibrant yellow that the user is expecting to be included in the part as printed by the additive manufacturing device.

However, the additive manufacturing device may not be able to print the vibrant yellow color as depicted by the 3D drafting and modeling computer program and expected by the user since the printing system such as the hardware, printing technology, materials and printing parameters used to form the part, while having a yellow color, may not be able to match exactly the vibrant yellow the user is expecting. Along with color, other characteristics of a part depicted in a workspace of a 3D drafting and modeling computer program that may not be accurately represented in an equivalent printed part may include the color under various illuminations, the surface roughness of the part, the texture of the part, the glossiness of the part, the translucency or opacity of the part, other characteristics of a part that may be depicted in a workspace of a 3D drafting and modeling computer program but might not accurately be realized in the printed part, and combinations thereof. Further, these characteristics of the part may be realized in a printed part differently when different materials are used, when different additive manufacturing devices using the same or different additive manufacturing processes are used to print the part, and even when different printing conditions that include a set of different parameters that define and control the actual printing process are used.

Further, the part printed by the additive manufacturing device may include mechanical characteristics such as mechanical strength, minimum feature sizes of the part, weak points within the construction of the part. These mechanical characteristics, however, are not portrayed in the workspace of a 3D drafting and modeling computer program or through soft-proofing of the part.

Examples described herein provide a system for presenting a soft-proof of a three-dimensional (3D) printed part. The system may include a processor, and a memory device communicatively coupled to the processor. The system may also include a communication link to support communication with a 3D printing device, and computer usable program code to, when executed by the processor, retrieves data from the 3D printing device defining at least one capability of the 3D printing device that affects an appearance of a part when printed. The system may also include an application programming interface (API) to provide data defining generation of a soft-proof of the part based on the at least one capability of the 3D printing device, the soft-proof of the part depicting characteristics of the part as the part appears as printed.

The API may include an indicator to convey an indication of appearance differences between the design of the part as presented in a computer aided design (CAD) computer program and the part as it appears as printed. Further, the appearance differences between the design of the part as presented in the CAD computer program and the part as it appears as printed may include which colors are outside a color gamut of the 3D printing system, appearance differences resulting from material changes, appearance differences resulting from print mode changes, appearance differences resulting from application of post processing, color differences between the original colors and colors of the printed parts where the original colors and the printed colors would be part of different color naming clusters, appearance differences due to of the application of different post-processing techniques, appearance differences due to material changes, or combinations thereof. The API may include an indicator to convey an indication of the at least one capability of the 3D printing device.

Examples described herein also provide a method of presenting a soft-proof of a three-dimensional (3D) printed part. The method may include loading a 3D designed part, retrieving data from a 3D printing device defining at least one capability of the 3D printing device that affects an appearance of the part when printed, providing data, via an application program interface (API), defining generation of a soft-proof of the part based on the at least one capability of the 3D printing device. The soft-proof of the part may depict characteristics of the part as the part appears as printed. The characteristics of the part as it appears as printed may include the part under a plurality of different light sources, and illumination conditions, the part as viewed at different positions and distances, the part with specific diffuse and specular material reflection characteristics, the glossiness of the part based on the printing material, the printing conditions, and post-printing processing, at least one texture of at least one portion of the part, the opacity of the part, the effects of at least one post-print process applied to the part, at least one mechanical property of the part, or combinations thereof.

Generating the soft-proof may include presenting the soft-proof within a computer aided design (CAD) computer program. The soft-proof of the part depicts characteristics of the part as it appears after at least one post printing process has been applied to the part. The characteristics of parts as they appear as printed by a 3D printing system may be obtained by at least one material appearance capturing device and stored as data within a data storage device. This characteristic may be obtained off-line from a collection of specially designed 3D objects and for a number of materials and print modes. A printing system may include a plurality of combinations of materials and print modes, and for each combination, an appearance characteristic may be captured, processed, and stored. When a part is loaded, a set of characteristics correlating to the combination of printer, material, and print mode that a user selects will be loaded and used.

The method may include conveying an indication of appearance differences between the design of the part as presented and the part as it appears as printed. The appearance differences between the design of the part and the part as it appears as printed may include which colors are outside a color gamut of the 3D printing device, appearance differences resulting from material changes, appearance differences resulting from print mode changes, appearance differences resulting from application of post processing, appearance differences regarding colors in the part as it appears as printed where the naming boundaries of the colors are crossed, appearance differences regarding areas on the part as it appears as printed where the colors or surface appearance would change by applying a specific post-processing technique, appearance differences regarding different materials used to print the part, or combinations thereof. The method may include determining at least one mechanical property of the part, and, via the API, add the mechanical property to the data defining the generation of the soft-proof of the part.

Examples described herein also provide a computer program for displaying a three-dimensional (3D) soft-proof on a display device. The computer program may include a computer readable storage medium including computer usable program code embodied therewith. The computer usable program code may, when executed by a processor, retrieve data from a 3D printing device defining at least one capability of the 3D printing device that affects an appearance of a 3D designed part when printed, and generate a soft-proof of the part based on the at least one capability of the 3D printing device. The soft-proof of the part may depict characteristics of the part as it appears as printed. The computer usable program code may, when executed by a processor, convey an indication of appearance differences between the soft-proof as presented and the part as the part appears as printed.

The computer program product may be a portion of a three-dimensional (3D) design computer program. The appearance differences between the design of the part and the part as it appears as printed comprise which colors are outside a color gamut of the 3D printing device, appearance differences resulting from material changes, appearance differences resulting from print mode changes, appearance differences resulting from application of post processing, appearance differences regarding colors in the part as it appears as printed where the naming boundaries of the colors are crossed, appearance differences regarding areas on the part as it appears as printed where the colors or surface appearance would change by applying a specific post-processing technique, appearance differences regarding different materials used to print the part, or combinations thereof. The computer program product may also include computer usable program code to, when executed by the processor, display characteristics of the part as it appears as printed based on material appearances as obtained from a capturing device.

As used in the present specification and in the appended claims, the term "soft-proofing" is meant to be understood broadly as any computer-aided, pre-printing process where a print job of a 3D object or part is depicted on a display device as it would look when printed by an additive manufacturing device.

As used in the present specification and in the appended claims, the term "part" is meant to be understood broadly as any 3D object that may be printed by a 3D printing device.

Turning now to the figures, FIG. 1 is a block diagram of a system for presenting a soft-proof of a three-dimensional (3D) printed part, according to an example of the principles described herein. The system may include a computing device (100) that is communicatively coupled to a 3D printing device (200). The computing device (100) may by any electrical or electronic device capable of being communicatively coupled to a 3D printing device (200) including, for example, a server, a desktop computer, a laptop computer, a personal digital assistants (FDA), a mobile device, a smartphone, a gaming system, and a tablet, among other electronic devices.

The 3D printing device (200) may be any device capable of forming a part or other 3D object. The 3D printing device (200) may include for example, a laser sintering, selective laser sintering, direct metal laser sintering, laser melting, selective laser melting, direct metal laser sintering, electron beam melting, powder bed 3D printing, powder bed fusion, or any variants, derivatives, or combinations thereof.

The computing device (100) may include a processor (101) and a data storage device (102) communicatively coupled to the processor (101). The data storage device (102) may store a number of computer programs including computer readable or computer usable program code. In the example of FIG. 1, a capability module (115) and a soft-proof application program interface (API) may be included within the data storage device (102). The capability module (115) may, when executed by the processor (101), retrieve data from the 3D printing device (200) where the data defines at least one capability of the 3D printing device (200) that affects an appearance of a part when the part is printed by the 3D printing device (200). The capabilities of the 3D printing device (200) may define how the part is printed including the methods of additive manufacturing, the materials used to form the part, the printing conditions and printing parameters under which the part is formed, the color gamut of the 3D printing system, the print modes available with the 3D printer (200), the fusing temperatures used by the 3D printer (200), layer thicknesses at which the 3D printer (200) prints the material, post printing processes such as tumbling, and combinations thereof. Further, the capabilities of the 3D printing device (200) may also include characteristics of the printed part that may result from the printing of the part such as, for example, the color, texture, translucency, roughness, porosity, rigidity, pliability, elasticity, strength, translucence, opacity, reflectivity, intensity, conductivity, among other perceptual attributes. Data regarding these characteristics may be stored in the data storage device (102) within, for example, a look-up table. In another example, the data regarding these capabilities and characteristics may be stored in a data storage device associated with or included within the 3D printing device (200).

The soft-proof API (116) may be any set of subroutine definitions, protocols, and tools for building program code that define methods of communication between various computer program components within and outside of the computing device (100). The soft-proof API (116) assists in communicating the 3D printer's (200) capabilities between the 3D printing device (200) and the computing device (100) to allow the computing device (100) to display that information within a user interface. In one example, the user interface may be a user interface of a 3D design computer program used to design the part to be printed. In this manner, the API serves to increase the abilities of the 3D computer program by providing the additional feature of viewing soft-proof of the part within the 3D design computer program.

In addition to the above information, the soft-proof API (116) may also convey additional appearance data such as, for example, a set of appearance reference objects that are available from the 3D printing device (200) and may be retrieved by the capability module (115) through the soft-proof API (116). The set of appearance reference objects may include 3D objects of specific shapes and colors that may effectively convey expected appearances of the 3D printed parts as presented in the soft-proof API (116). These appearance reference objects may also depict mechanical performance of 3D objects printed by the 3D printing device (200) as printed in specified printing modes of the 3D printing device (200), Further, the soft-proof API (116) may also convey a set of default color palettes from which the user may choose to modify the color of the part or other 3D object as presented.

Figure 2:
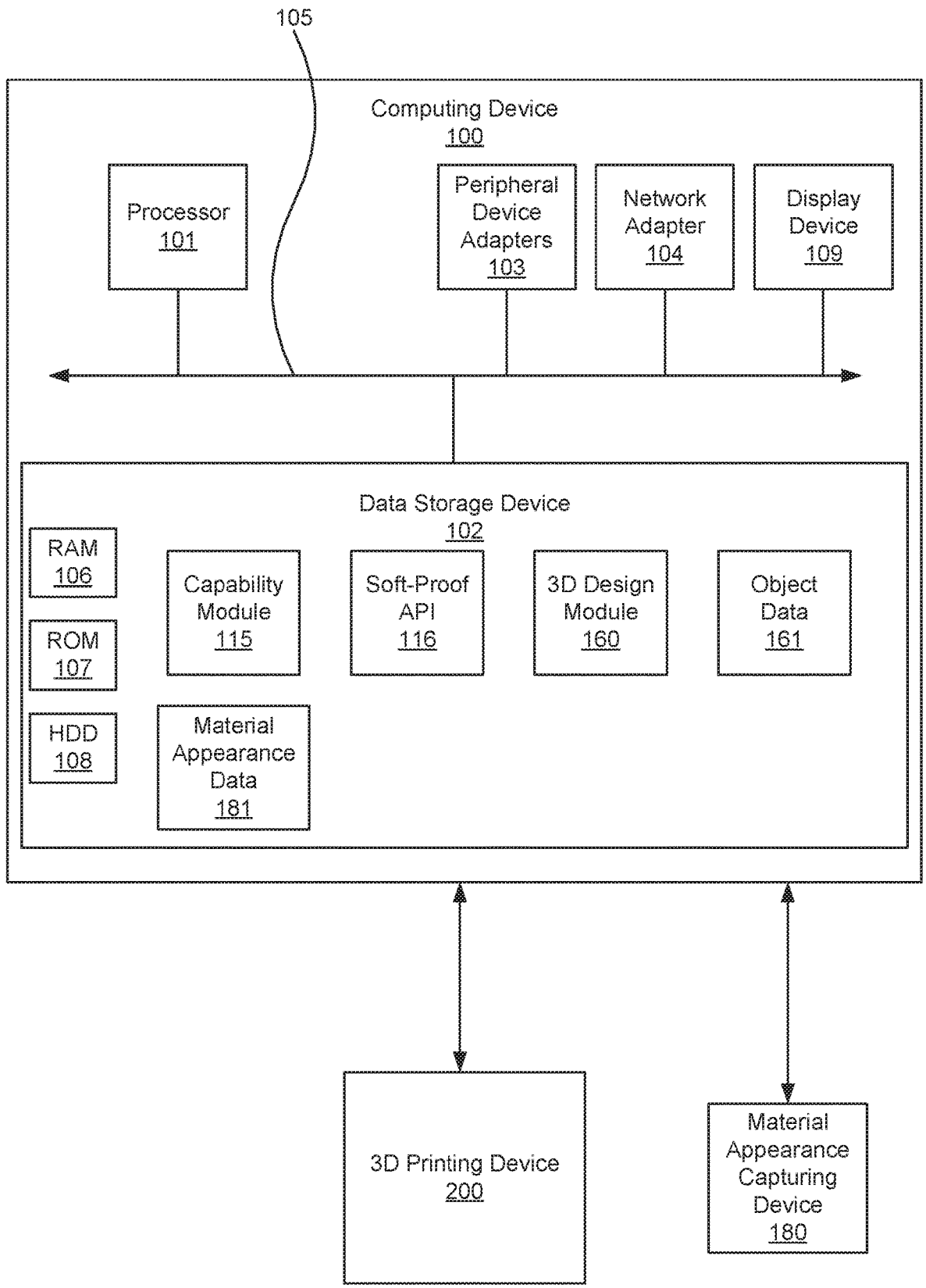
FIG. 2 is a block diagram of a system for presenting a soft-proof of a part, according to another example of the principles described herein.

FIG. 2 is a block diagram of a system for presenting a soft-proof of a part, according to another example of the principles described herein. The elements described in connection with FIG. 1 are included within the system of FIG. 2, and description of these elements are provided herein in connection with FIG. 1. The computing device (100) of FIG. 2 as well as the computing device (100) of FIG. 1 may be utilized in any data processing scenario including, stand-alone hardware, mobile applications, through a computing network, or combinations thereof. Further, the computing device (100) may be used in a computing network, a public cloud network, a private cloud network, a hybrid cloud network, other forms of networks, or combinations thereof. In one example, the methods provided by the computing device (100) are provided as a service over a network by, for example, a third party. In this example, the service may comprise, for example, the following: a Software as a Service (SaaS) hosting a number of applications; a Platform as a Service (PaaS) hosting a computing platform comprising, for example, operating systems, hardware, and storage, among others; an Infrastructure as a Service (IaaS) hosting equipment such as, for example, servers, storage components, network, and components, among others; application program interface (API) as a service (APIaaS), other forms of network services, or combinations thereof. The present systems may be implemented on one or multiple hardware platforms, in which the modules in the system can be executed on one or across multiple platforms. Such modules can run on various forms of cloud technologies and hybrid cloud technologies or offered as a SaaS (Software as a service) that can be implemented on or off the cloud. In another example, the methods provided by the computing device (100) are executed by a local administrator.

To achieve its desired functionality, the computing device (100) comprises various hardware components. Among these hardware components may be a number of processors (101), a number of data storage devices (102), a number of peripheral device adapters (103), a number of network adapters (104), and a number of display devices (109). These hardware components may be interconnected through the use of a number of busses and/or network connections. In one example, the processor (101), data storage device (102), peripheral device adapter (103), network adapter (104), and display device (109) may be communicatively coupled via a bus (105).

The processor (101) may include the hardware architecture to retrieve executable code from the data storage device (102) and execute the executable code. The executable code may, when executed by the processor (101), cause the processor (101) to implement at least the functionality of loading 3D parts, retrieving data from a 3D printing device defining at least one capability of the 3D printing device that affects an appearance of the part when printed, providing data via an API that defines the generation of a soft-proof of the part based on the capabilities of the 3D printing device, and other processes according to the methods of the present specification described herein. In the course of executing code, the processor (101) may receive input from and provide output to a number of the remaining hardware units.

The data storage device (102) may store data such as executable program code that is executed by the processor (101) or other processing device. As will be discussed, the data storage device (102) may specifically store computer code representing a number of applications that the processor (101) executes to implement at least the functionality described herein.

The data storage device (102) may include various types of memory modules, including volatile and nonvolatile memory. For example, the data storage device (102) of the present example includes Random Access Memory (RAM) (106), Read Only Memory (ROM) (107), and Hard Disk Drive (HDD) memory (108). Many other types of memory may also be utilized, and the present specification contemplates the use of many varying type(s) of memory in the data storage device (102) as may suit a particular application of the principles described herein. In certain examples, different types of memory in the data storage device (102) may be used for different data storage needs. For example, in certain examples the processor (101) may boot from Read Only Memory (ROM) (107), maintain nonvolatile storage in the Hard Disk Drive (HDD) memory (108), and execute program code stored in Random Access Memory (RAM) (106).

The data storage device (102) may comprise a computer readable medium, a computer readable storage medium, or a non-transitory computer readable medium, among others. For example, the data storage device (102) may be, but not limited to, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random-access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain or store a program for use by or in connection with an instruction execution system, apparatus, or device.

The hardware adapters (103, 104) in the computing device (100) enable the processor (101) to interface with various other hardware elements, external and internal to the computing device (100). For example, the peripheral device adapters (103) may provide an interface to input/output devices, such as, for example, the 3D printing device (200), a material appearance capturing device (180), the display device (109), a mouse, or a keyboard. The peripheral device adapters (103) may also provide access to other external devices such as an external storage device, a number of network devices such as, for example, servers, switches, and routers, client devices, other types of computing devices, and combinations thereof.

The display device (109) may be provided to allow a user of the computing device (100) to interact with and implement the functionality of the computing device (100). The peripheral device adapters (103) may also create an interface between the processor (101) and the display device (109), a printer, or other media output devices. Although the display device (109) is depicted in FIG. 2 as being a part of the computing device (100), the display device (109) may be external to the computing device (109). Examples of display devices (109) include a computer screen, a laptop screen, a mobile device screen, a personal digital assistant (FDA) screen, and a tablet screen, among other display devices (106).

The network adapter (104) may provide an interface to other computing devices within, for example, a network, thereby enabling the transmission of data between the computing device (100) and other devices located within the network. For example, the network adapter (104) may provide an interface between the computing device (100) and the 3D printing device (200) and material appearance capturing device (180).

The computing device (100) may, when executed by the processor (101), display a number of graphical user interfaces (GUIs) on the display device (109) associated with the executable program code representing the number of applications stored on the data storage device (102). The GUIs may include aspects of the executable code including 3D part designing and soft-proofing of the part. The GUIs may display, for example, the part as designed, and a soft-proof of the part as it actually looks if printed using a number of print parameters available via the 3D printing device (200). Examples of the GUIs displayed on the display device (109), will be described in more detail below.

The computing device (100) further comprises a number of modules used in the implementation of loading 3D parts, retrieving data from a 3D printing device defining at least one capability of the 3D printing device that affects an appearance of the part when printed, providing data via an API that defines the generation of a soft-proof of the part based on the capabilities of the 3D printing device, and other processes according to the methods of the present specification described herein. The various modules within the computing device (100) comprise executable program code that may be executed separately. In this example, the various modules may be stored as separate computer program products. In another example, the various modules within the computing device (100) may be combined within a number of computer program products; each computer program product comprising a number of the modules.

The computing device (100) may include the capability module (115) described herein in connection with FIG. 1 to, when executed by the processor (101), retrieve data from the 3D printing device (200) where the data defines at least one capability of the 3D printing device (200) that affects an appearance of a part when the part is printed by the 3D printing device (200) among other functions of the capability module (115) described herein.

The computing device (100) may include a 3D design module to, when executed by the processor (101), allow a user to design a 3D part. The 3D design module (160) may be any computer aided design (CAD) program that allows a user to design curves, surfaces, and solids in three-dimensional (3D) space. The 3D design module (160) may also provide for the conversion of the 3D modules deigned thereby into object data (161) that provides instructions to the 3D printing device (200) on how to form or "print" the 3D part. The 3D printing device (200) may print the part defined by the object data (161) once the object data is sent to the 3D printing device (200).

The computing device (100) may include a soft-proof API (116) to, when executed by the processor (101), communicates the 3D printer's (200) capabilities between the 3D printing device (200) and the computing device (100) to allow the computing device (100) to display that information within a GUI. In one example, the soft-proof API (116) may display the capabilities in a GUI of the 3D design module (160). In this example, the soft-proof API may act as a plug-in for the 3D design module (160). In this example, the soft-proof API (116) may be a computer code component that adds a specific feature to an existing computer program such as the 3D design module (160) by adding a number of features regarding the soft-proofing of the part as designed by the 3D design module (160).

With reference to FIG. 2, the capabilities of the 3D printing device (200) including any parameters that may affect the appearance of the printed part may be communicated through the soft-proof API (116) to the 3D design module (160). Although the 3D design module (160) is depicted as being a part of the computing device (100), the 3D design module, in one example, may be executed on a separate computing device external to the computing device (100). The 3D design module (160) may load a 3D designed part in any available format such as, for example, stereolithography (STL) file formats, 3D manufacturing formats (3MF), and other 3D design file formats.

The 3D design module (160) and the soft-proof API (116) may retrieve information from the 3D printing device (200) regarding the capabilities of the 3D printing device (200) that may affect appearance of the part as printed. For example, the capabilities communicated from the 3D printing device (200) to the 3D design module (160) may include a number of print modes including processing times and temperatures, the print materials that may be used by the 3D printing device (200) to form the part, available print color agents to color the different portions of the printed part, layer thicknesses used by the 3D printing device (200) during the printing process, the orientation of the part on a print bed of the 3D printing device (200) which may or may not affect the final color and other visual aspects of the printed part and/or the visibility of stair-steps), information of the appearance of printed colors including tagging of any anisotropic color behavior through at least one International Color Consortium (ICC) profiles or equivalent color tables, potential post-processing treatments such as tumbling, sanding, cutting, etc., other capabilities of the 3D printing device (200), and combinations thereof.

The 3D design module (160) and the soft-proof API (116) may generate an accurate soft-proof of the part. The soft-proof of the part may include an impression of the appearance of the printed and, in some examples, post-processed part or 3D object. In one example, the 3D design module (160) and the soft-proof API (116) may utilize rendering computer code to present the part within a GUI of the 3D design module (160), The rendering code may include code that provides a visualization of the part under a variety of light sources with a variety of different color temperatures, diffuse illumination and/or spotlights, and illumination conditions including a variety of different environment maps. The rendering code may also include code that provides a visualization of the part from a number of camera positions to provide the ability to change the observer and/or camera position and the distance from the part to zoom in on surface details and zoom out to see the entirety of the part.

The rendering code may also include code that provides a visualization of the part under diffuse lighting conditions. These renderings may include the ability to display on the GUI presented by the 3D design module (160) and the soft-proof API (116) any anisotropic color behavior resulting from the 3D printing process, captured by at least one material appearance capturing devices and represented for example through at least one ICC profiles.

The rendering code may also include code that provides a visualization, which is material specific and describes the color of the specular highlights of the material used to form the part. As the 3D printing device (200) may use any number or combinations of materials to build and form the part, these different materials may have differing diffuse and specular reflection properties. The rendering code may use this information for the visualization of these different materials. The rendering code may also include code that provides a visualization of the part's glossiness. The glossiness of the part may depend on the printing material, the printing conditions, post-processing applications, and combinations thereof, and this attribute of the printed part may be visualized through the GUIs produced by the 3D design module (160) and the soft-proof API (116).

The GUIs produced by the 3D design module (160) and the soft-proof API (116) may also render the roughness, or textures, of the different surfaces of the part, and may do so depending on the surfaces' orientation in the print and the effects of the applied halftoning or other reprographic techniques that simulate continuous tone imagery. Opacity and translucency of the part may also be rendered on the GUIs produced by the 3D design module (160) and the soft-proof API (116). In one example, the opacity and translucency of the part may depend on the printing material, agents, print mode and printing conditions utilized by the 3D printing device (200). In one example, the GUIs produced by the 3D design module (160) and the soft-proof API (116) may render the part to include the effects of various post-printing processing including, for example, sand blasting, tumbling, sanding, cutting, waxing, or other post-printing processes, and combinations thereof perform on the printed part.

The material appearance capturing device (180) may be part of the system or may be completely separate from the computing device (100). In one example, a material appearance capturing device (180) may be used to capture appearance characteristics described herein of printed parts. An example of a material appearance capturing device (180) may include the TAC7™ material appearance scanner produced and distributed by X-Rite, Inc. In another example, the material appearance capturing device (180) may be at least one device that store the captured appearance characteristics of a large variety of materials. Data provided by the material appearance capturing device (180) may be stored in the data storage device (102) as material appearance data (181) for use by the 3D design module (160) and the soft-proof API (116) for depicting the part as it may look as printed by the 3D printing device (200), In another example, the material appearance data (181) may be stored in a data storage device of the 3D printing (200) and may be provided to the computing device (100) when the capability module (115) makes its request to the 3D printing device (200).

The capability module (115) may also obtain appearance metadata that defines how the materials used to print the part effect the visual appearance of the part. For example, the appearance metadata may define the appearance differences resulting from changes in the material used to print the part, changes in the print mode used to print the part, the appearance differences after applying a number of post-print processing. The appearance metadata includes data that defines whether the colors of the printed part are within or outside a color gamut achievable by the 3D printing device (200). The capability module (115) obtains metadata relating to the colors in a part where the user may expect to see strong changes from the colors on a monitor to the colors of the printed part.

Further, the capability module (115) obtains metadata relating to the colors in a part where the user should expect that the naming boundaries or naming conventions are crossed between the original colors and the corresponding colors achieved by printing. In this example a user might make slight color modifications to the original color to avoid getting a printed color that would fall into a different color category and would be described by a different name.

Further, the capability module (115) may obtain metadata relating to where the colors and/or surface appearance of the part may change by applying a specific post-printing processing. In one example, the capability module (115) may provide this metadata to the 3D design module (160) and the soft-proof API (116) to render these color and/or surface appearance changes brought on by the post-printing process by highlighting areas on the part where this may be manifested. For example, if the color difference is above a threshold, the color difference may be rendered by the 3D design module (160) and the soft-proof API (116) in a manner in which the user can easily be made aware of the changes. These changes may also be indicated for other appearance attributes described herein such as glossiness, etc. The user may then be given the opportunity to decide if they want the post-processing to be performed or not based on the visualization rendered by the 3D design module (160) and the soft-proof API (116) for both cases where the post-printing process is and is not applied.

Still further, the capability module (115) may obtain metadata regarding how appearance attributes such as color, gloss, and surface appearance change if different materials are used. Again, in one example, the capability module (115) may provide this metadata to the 3D design module (160) and the soft-proof API (116) to render these appearance attributes brought on by changes in the materials used to print the part by highlighting areas on the part where this may be manifested. For example, a part may be printed using two different polyamides such as PA11 and PA12. In this example, the capability module (115) may provide metadata regarding these two materials to the 3D design module (160) and the soft-proof API (116), and the 3D design module (160) and the soft-proof API (116) may render the part indicating the appearance differences between those two materials. In one example, these differences in color based on the materials used by the 3D printing device (200) may be coded or false colored to assist the user in identifying the manner in which the changes in the materials effects the appearance of the printed part in an analogous manner in the way altitude is colored on an elevation map.

As described herein, the capability module (115) may also obtain metadata regarding mechanical information of the part and provide this metadata to the 3D design module (160) and the soft-proof API (116) to render the part indicating these mechanical attributes of the part (503). In one example, the 3D design module (160) and the soft-proof API (116) may display an infographic view of the mechanical properties of the part that for example shows the differences in strength of a number of portions of the part, difference in strength between printing the part with two different materials, and combinations thereof. In one example, the different views may be presented using a color-coded legend where different colors indicate strength of the part throughout the entirety of the part. Further, in one example, the views of the mechanical properties of the part may be color-coded by thresholds. Further, in one example, the part or areas on part that are too thin to be printed robustly without breaking may be marked using an indicator such as an arrow or using a color-coded indicator where, for example, green transitioning into red indicates a change from a strong portion of the part to a weaker portion of the part, respectively. Further, the 3D design module (160) and the soft-proof API (116) may render the part to indicate when fine features or specific elements or portions of an individual part are too close together that there is a high risk that these elements or portions may fuse together.

Figure 3:
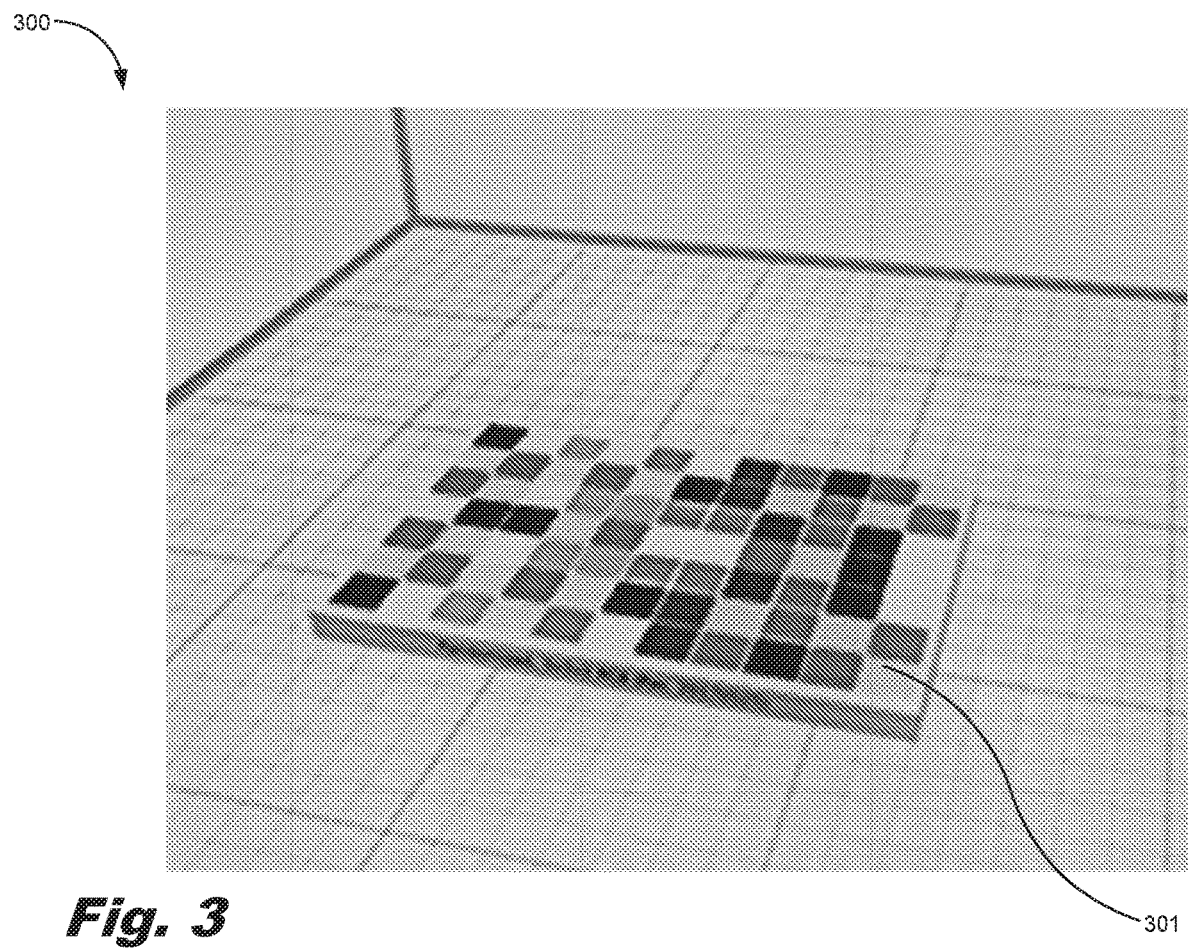
FIG. 3 is a screenshot of a graphical user interface depicting a soft-proof of a color tile acting as a designed part as may be depicted before consideration of the part's characteristics as printed, according to an example of the principles described herein.
Figure 4:
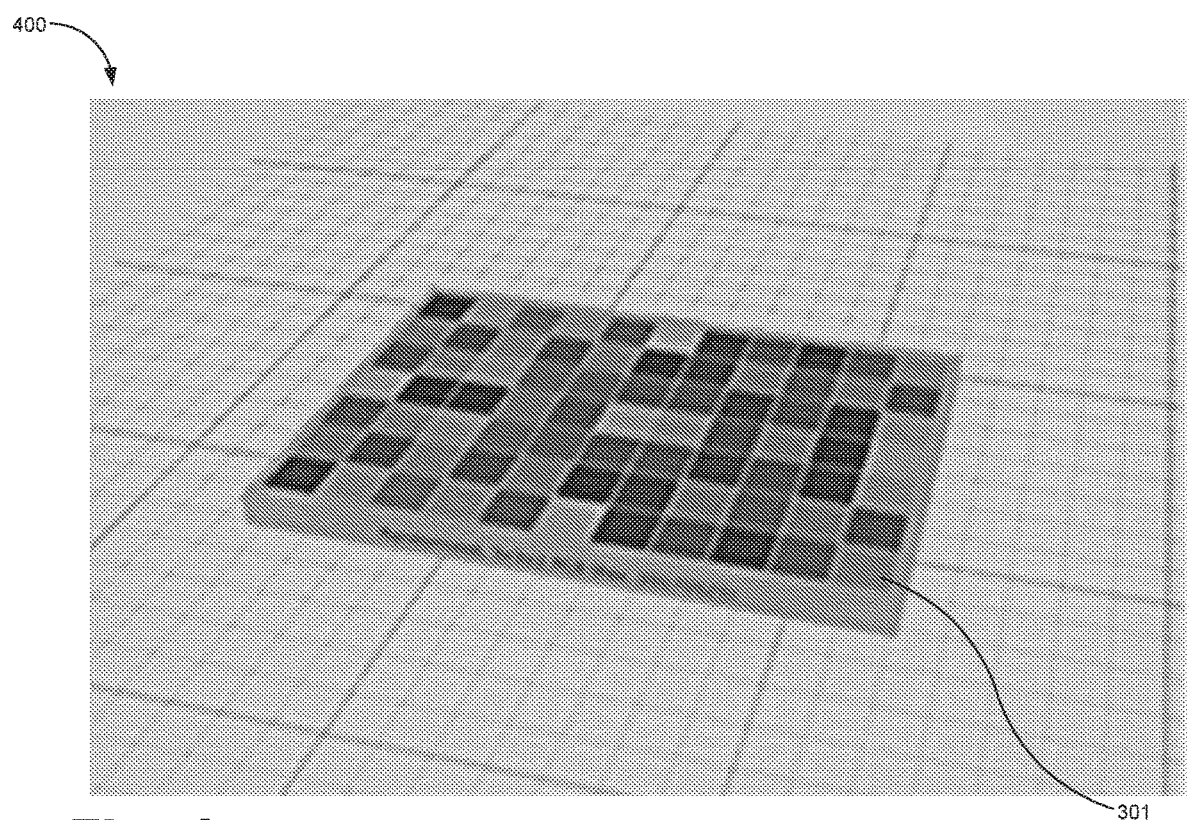
FIG. 4 is a screenshot of a graphical user interface depicting a soft-proof of the color tile of FIG. 3 as may be depicted after consideration of the part's characteristics as printed, according to an example of the principles described herein.
Figure 5:
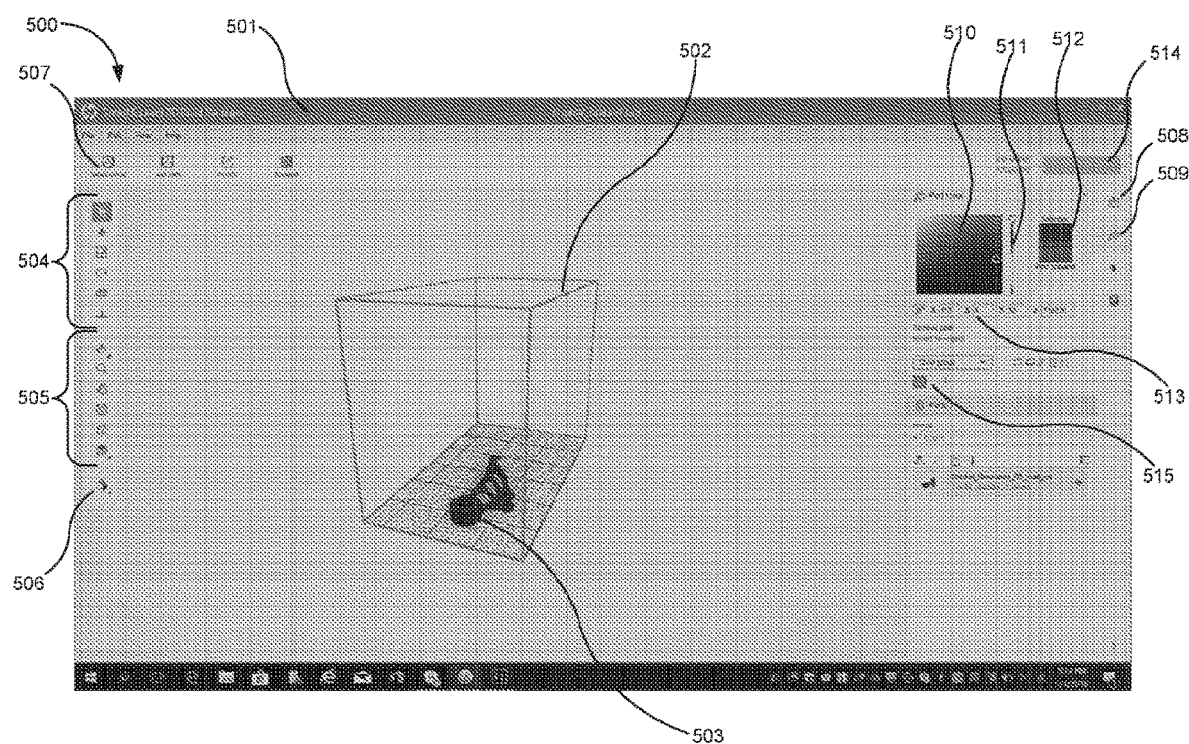
FIG. 5 is a screenshot of a graphical user interface depicting a soft-proof of a part in a color viewing mode, according to an example of the principles described herein.

FIG. 3 is a screenshot (300) of a graphical user interface (GUI) depicting a soft-proof of a color tile (401) acting as a designed part as may be depicted before consideration of the part's characteristics as printed, according to an example of the principles described herein. Further, FIG. 4 is a screenshot (400) of a GUI depicting a soft-proof of the color tile (300) of FIG. 3 as may be depicted after consideration of the part's characteristics as printed, according to an example of the principles described herein. FIGS. 3 and 4 depict the difference between the manner in which the 3D design module (160) may depict the color tile (300) without the data obtained by the capability module (115) and provided by the soft-proof API (116), and the manner in which the 3D design module (160) may depict the color tile (300) with the data obtained by the capability module (115) and provided by the soft-proof API (116), As may be distinguished between the color tiles (300) as depicted in FIG. 3 and FIG. 4, the actual printed color tile (301) of FIG. 4 may have different coloring, texture, translucency, roughness, porosity, rigidity, pliability, elasticity, strength, translucence, opacity, reflectivity, intensity, and conductivity among other properties that the depicted color tile (301) in FIG. 3 do not depict. For example, as depicted in FIG. 4, the color tile (301) may have more muted colors and off-white or grayed out whites rather than more vibrant colors and truer whites as depicted in the color tile rendering in FIG. 3. This is due to the how the part is printed including the methods of additive manufacturing, the materials used to form the part, the conditions under which the part is formed including the print modes available with the 3D printer (200), the fusing temperatures used by the 3D printer (200), layer thicknesses at which the 3D printer (200) prints the material, post printing processes such as tumbling, other aspects of the process of 3D printing device (200), and combinations thereof. Thus, through the use of the capability module (115) and the soft-proof API (116) in connection with the 3D design module (160) allows the user to view the part as it may look when printed using the 3D printing device (200). This allows a user to have a better idea as to what the part will look like after the printing of the part and may provide better expectations of the capabilities of the 3D printing device (200), FIG. 5 is a screenshot (500) of a GUI (501) depicting a soft-proof (502) of a part (503) in a color viewing mode, according to an example of the principles described herein. In one example, the GUIs (501) described herein may be depicted within a series of GUIs provided by the 3D design module (160). In another example, the GUIs (501) described herein may be depicted within a separate computing program from the 3D design module (160).

The GUI (501) may include a number of tools (504) such as pointing, navigating, and selection tools. The GUI (501) may also include a number of viewing tools (505) used to view the soft-proof (502) such as zooming tools, panning tools, and rotation tools, among other viewing tools.

Further, the GUI (501) may include a print preview button (506). The print preview button (506) may be a button used to toggle between a depiction of the soft-proof (502) of the part (503) and a depiction of the part (503) that may be edited using edit tools as may be provided by the 3D design module (160). Once a user selects the print preview button (506), the soft-proof (502) of the part (503) may be depicted, and a number of additional functions and features may be made available through the GUI (501). These additional functions and features may include, a printer selection button (507) that allows a user to select a 3D printing device (200) to use in printing the part. In one example, a plurality of 3D printing devices (200) may be communicatively coupled to the computing device (100) to allow for a wider range of printing processes, techniques, and materials to be provided to the user. Thus, selecting one 3D printing device (200) over another may change the options made available through the GUI (501).

The GUI (501) may also include a job summary tab (508) and a part color tab (509). The part color tab (509), when selected as depicted in FIG. 5, may provide for the display of available colors that the part (503) may be printed in. A lightness selector (511), a hue and saturation selector (510), and a color palate (515) may be presented once the part color tab (509) is selected. Once a user selects a particular hue and lightness via the lightness selector (511) and hue and saturation selector (510) or a color from the color palette (515), that selected color with the selected hue, saturation and lightness may be presented in the soft-proof (502) of the part (503) in the GUI (501). Further, a color distinguisher (512) may also be presented to the user. The color distinguisher (512) may depict a color as selected by the user, and a print preview of that color as the printed part may have juxtaposition to one another so that the user may be able to distinguished between the selected color as presented in the GUI (501) or as presented by the 3D design module (160) when the print preview button (506) is selected. Thus, as the user selects and deselects the print preview button (506), the color as presented in the 3D design module (160) may be presented when the print preview button (506) is deselected, and the actual color of the part as will be printed may be presented when the print preview button (506) is selected. In the example of FIG. 5, the part (503) is depicted as the part would look with the color distinguisher (512) depicting a color as selected by the user since the user has selected a color that is visualized in the top portion of the color distinguisher (512).

The user may also manually enter the color by entering, for example, hexadecimal numbers representing colors in the red, green, blue (RGB) color model. The colors are represented in the sRGB color space. The entry of sRGB values are depicted in the figures as an example, and other manual color entries may be based on any color model. The color may also be entered as a triplet of numbers.

Figure 6:
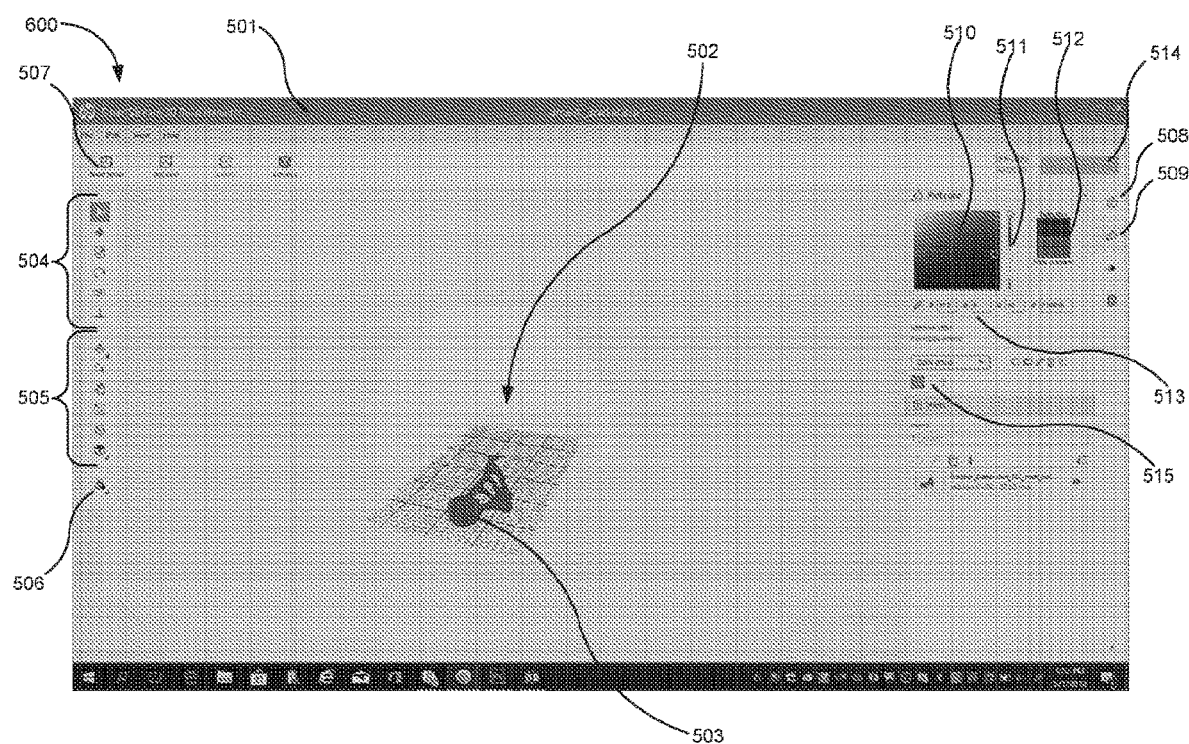
FIG. 6 is a screenshot of a graphical user interface depicting a soft-proof of a part in a color viewing mode, according to another example of the principles described herein.

FIG. 6 is a screenshot (600) of the GUI (501) depicting a soft-proof (502) of the part (503) in a color previewing mode, according to another example of the principles described herein. The example of FIG. 6 depicts the part (503) in a state at which the part (503) would look once it is printed. The color of the part itself (503) and the color of the lower part of the color distinguisher (512) visualize the printed color of the part.

Figure 7:
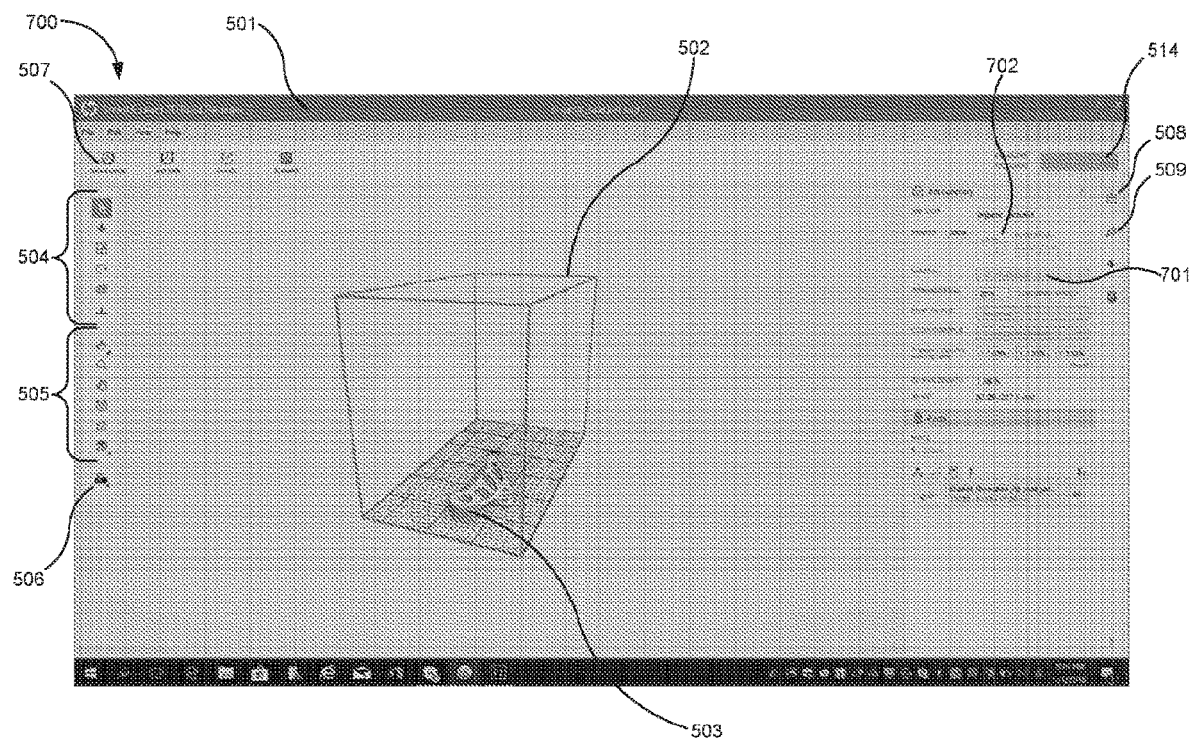
FIG. 7 is a screenshot of a graphical user interface depicting a soft-proof of a part in a mechanical viewing mode, according to an example of the principles described herein.
Figure 8:
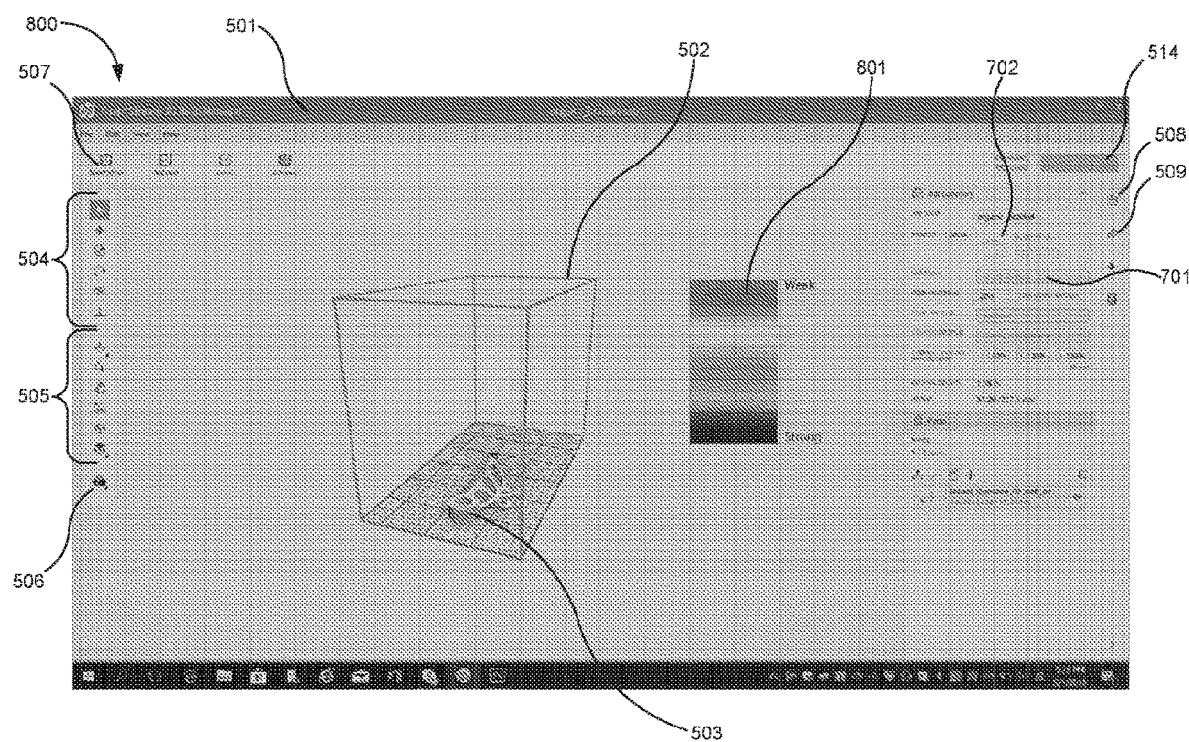
FIG. 8 is a screenshot of a graphical user interface depicting a soft-proof of a part in a mechanical viewing mode including a legend, according to an example of the principles described herein.

FIG. 7 is a screenshot (700) of the GUI (501) depicting a soft-proof (502) of the part (503) in a mechanical viewing mode, according to an example of the principles described herein. Further, FIG. 8 is a screenshot (800) of the GUI (501) depicting a soft-proof (502) of the part (503) in a mechanical viewing mode including a legend (801), according to an example of the principles described herein. As described herein, the capability module (115) may also obtain metadata regarding mechanical information of the part and provide this metadata to the 3D design module (160) and the soft-proof API (116) to render the part indicating these mechanical attributes of the part (503). Thus, the examples of FIG. 7 and FIG. 8 may be used to depict these mechanical attributes of the part (503). The job summary tab (508) may be selected to display a number of additional selectable functions appertaining to the mechanical attributes of the part (503). For example, the ability to change the material used by the 3D printing device (200) by using a material selection dropdown menu (701). The user may select a number of materials from a list of materials available to be printed by the 3D printing device selected at the 3D printing device selection button (702). The 3D printing device selection button (702) may open up a drop-down menu or other window from which the user may select from a plurality of 3D printing devices (200) communicatively coupled to the computing device (100). Once the user selects a 3D printing device (200), the material selection dropdown menu (701) may be accessed to select any of a number of materials that the 3D printing device (200) may use to print the part (503).

In FIG. 8, a soft-proof (502) of the part (503) in a mechanical viewing mode may include a legend (801) that provides an indication to a user viewing the soft-proof (502) as how the mechanical attributes of the part (503) are located within and vary across the part (503). As described herein, in one example, the different views may be presented using a color-coded legend (801) where different colors indicate strength of the part (503) throughout the entirety of the part (503). Further, in one example, the views of the mechanical properties of the part (503) may be color-coded by thresholds. Further, in one example, the part (503) or areas on part (503) that are too thin to be printed robustly without breaking may be marked using an indicator such as an arrow or using a color-coded indicator where, for example, green transitioning into red indicates a change from a strong portion of the part to a weaker portion of the part, respectively. Further, the 3D design module (160) and the soft-proof API (116) may render the part (503) to indicate when fine features or specific elements or portions of an individual part (503) are too close together that there is a high risk that these elements or portions may fuse together.

The GUI (501) may also include a send to print button (514) that sends the object data (161) representing the part (503) and the user selections made via the GUI (501) to the 3D printing device (200), In this manner, the user's particular selections of the part's (503) look and feel may be realized in a printed part.

As the user selects the desired look of the part (503) through the various options available to through the GUI (501) as depicted in FIGS. 5 through 8, the part (503) is depicted in the soft-proof (502) of the GUI (501). In this manner, the user may have a better idea as to what the part will look like when it is actually printed.

Figure 9:
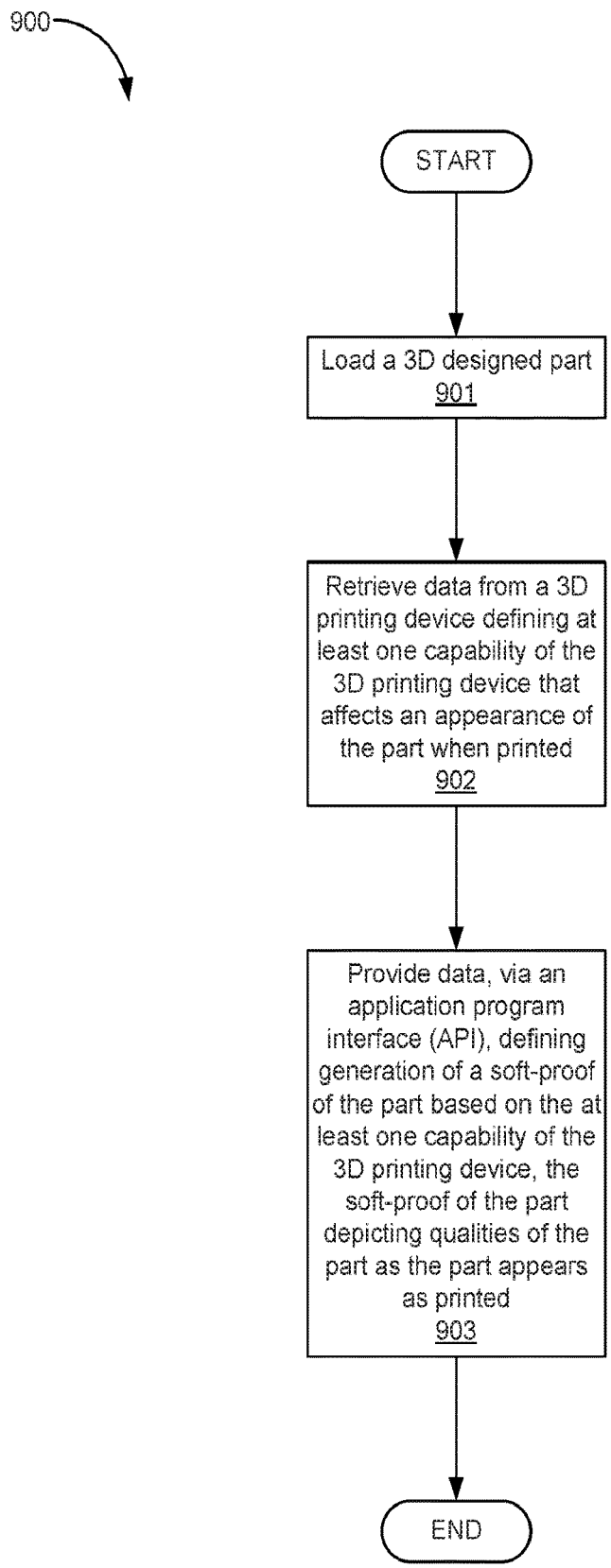
FIG. 9 is a flowchart showing a method of presenting a soft-proof of a part, according to an example of the principles described herein.

FIG. 9 is a flowchart showing a method (900) of presenting a soft-proof (502) of a part (503), according to an example of the principles described herein. The method (900) may include loading (block 901) a 3D designed part (503). The loading (block 901) of the 3D designed part (503)

may include the 3D design module (160) being executed by the processor (101) and opening a data file representing the part (503) that may be visualized and modified by the 3D design module (160). The data file representing the part (503) may be stored either in the data storage device (102) or an external data storage device with respect to the computing device (100).

The method (900) may also include retrieving (block 902) data from a 3D printing device (200) defining at least one capability of the 3D printing device (200) that affects an appearance of the part (503) when printed. Those capabilities and associated characteristics are described herein. The method (900) may also include providing (block 903) data, via an application program interface (API), defining generation of a soft-proof (502) of the part (503) based on the at least one capability of the 3D printing device (200). The soft-proof (502) of the part (503) depicts characteristics of the part (503) as the part (503) appears as printed.

Figure 10:
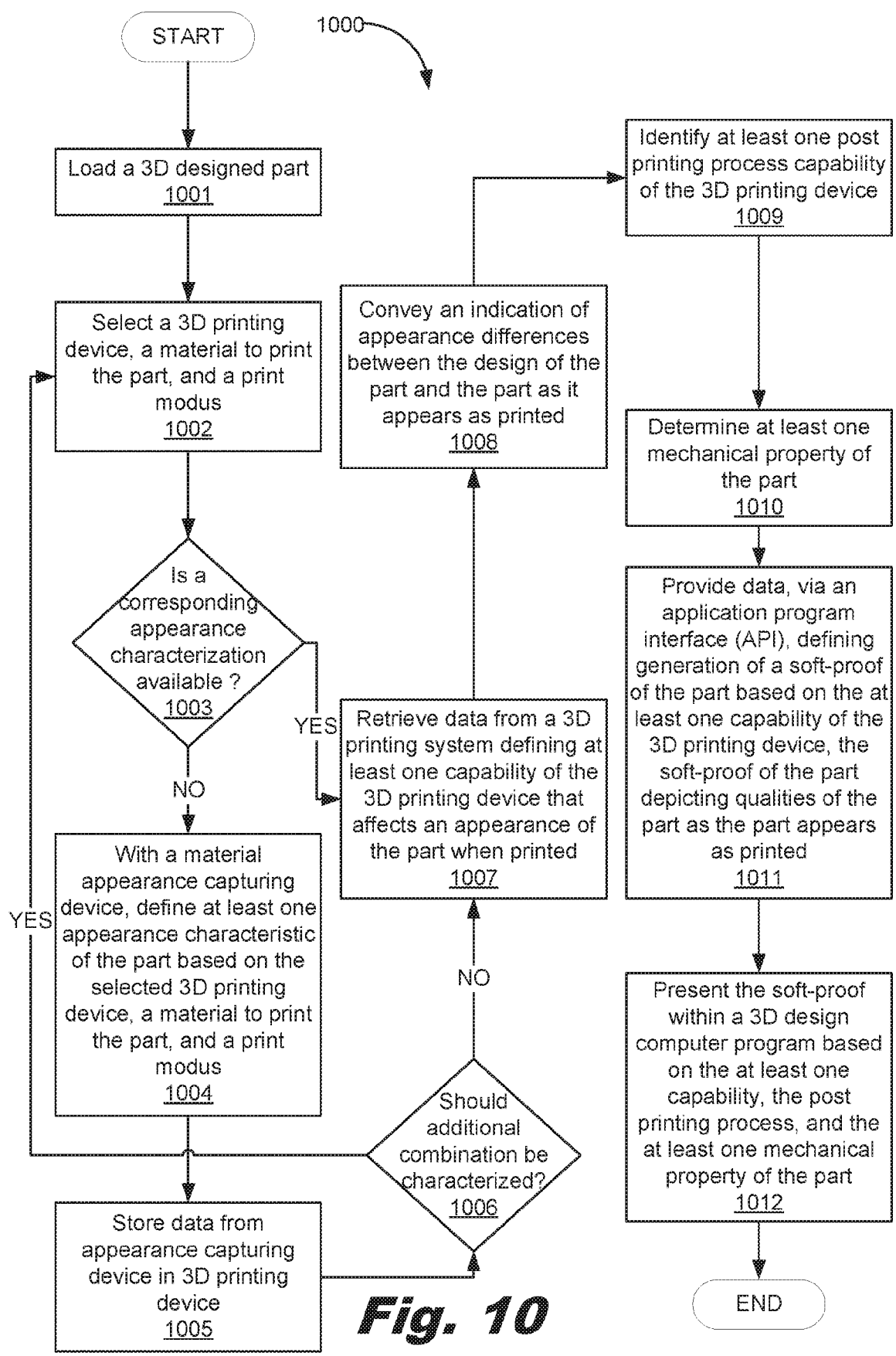
FIG. 10 is a flowchart showing a method of presenting a soft-proof of a part, according to another example of the principles described herein.

FIG. 10 is a flowchart showing a method (1000) of presenting a soft-proof (502) of a part (503), according to another example of the principles described herein. The method (1000) of FIG. 10 may include loading (block 1001) a 3D designed part (503). The user may then be prompted to select (block 1002) a 3D printing device (200), a material from which to print the part that the 3D printing device (200) may offer as a printable material, and a print modus that the 3D printing device (200) may use to print the part.

A determination (block 1003) may be made to determine whether a corresponding appearance characterization is available for the selected 3D printing device (200), material, and print modus from a database of such appearance characterization obtained through use of a material appearance capturing device (180). In response to a determination that the corresponding appearance characterization for the selected combination is available (block 1003, determination YES), data defining that selected combination of 3D printing device (200), material, and print modus may be loaded from a data storage device, and may be used for soft-proofing and printing of the part. The method (1000) may proceed to block 1007.

In response to a determination that the corresponding appearance characterization for the selected combination is not available (block 1003, determination NO), then, with the material appearance capturing device (180), at least one appearance characteristic of the part (503) may be defined (block 1004). In one example, the at least one appearance characteristic of the part (503) may be defined (block 1004) based on the selected 3D printing device (200), a material from which to print the part that the 3D printing device (200) may offer as a printable material, and a print modus that the 3D printing device (200) may use to print the part obtained at block 1004. Data obtained from the material appearance capturing device (180) may be stored (block 1005) in a data storage device (102) of the 3D printing device (200).

It may be determined (block 1006) whether additional combinations of selected a 3D printing device (200), a material from which to print the part that the 3D printing device (200) may offer as a printable material, and a print modus that the 3D printing device (200) may use to print the part should be characterized. Since there are many different combinations of the 3D printing devices, printing materials, and print modus, the appearances of the resulting object captured by the material appearance capturing device (180) may widely differ. In response to a determination that there are additional combinations of selected 3D printing devices (200), printing materials, and print modus to be characterized (block 1006, determination YES), then the method (1000) may loop back to block 1002 to perform such a characterization.

In response to a determination that there are no additional combinations of selected 3D printing devices (200), printing materials, and print modus to be characterized (block 1006, determination NO), then the method (1000) may include retrieving (block 1007) data from a 3D printing device (200) defining at least one capability of the 3D printing device (200) that affects an appearance of the part (503) when printed. Further, an indication of appearance differences between the design of the part (503) and the part (503) as it appears as printed may be conveyed (block 1008) to the capability module (115), the 3D design module (160) and the soft-proof API (116) for presentation to a user in the soft-proof (502) of the part (503).

In one example, the material appearance capturing device (180) may be operated offline relative to the functions of the computing device (100) and the 3D printing device (200). Further, the capturing of the appearances of various materials may be performed once per 3D printing device used in connection with the computing device (100), per material used in the 3D printing devices (200), per print modes used by the 3D printing devices (200), and combinations thereof. Further in one example, the acquisition and storage of data from the material appearance capturing device (180) as described herein in connection with blocks 1004 through 1006 may be performed offline and once per combination of selected 3D printing devices (200), printing materials, and print modus. In this manner, data defining a selected combination may be loaded from the data storage device where this data is stored, and may be used for soft-proofing and printing of the part.

At least one post-printing process capability of the 3D printing device (200) may be identified (block 1009) using the capability module (115). Further, at least one mechanical property of the part (503) may be determined (1010) by the capability module (115). Data may be provided (block 1011) via the soft-proof API (116) where the data defines generation of a soft-prof (502) of the part (503) based on the at least one capability of the 3D printing device (200), the soft-proof (502) of the part (503) depicting qualities of the part (503) as the part (503) appears as printed by the 3D printing device (200). The method (1000) may also include presenting (block 1012) the soft-proof (502) within a 3D design computer program such as the 3D design module (160) based on the at least one capability, the post-printing process, and the at least one mechanical property of the part (503) as provided at blocks 1003, 1005, and 1006 respectively.

Figure 11:
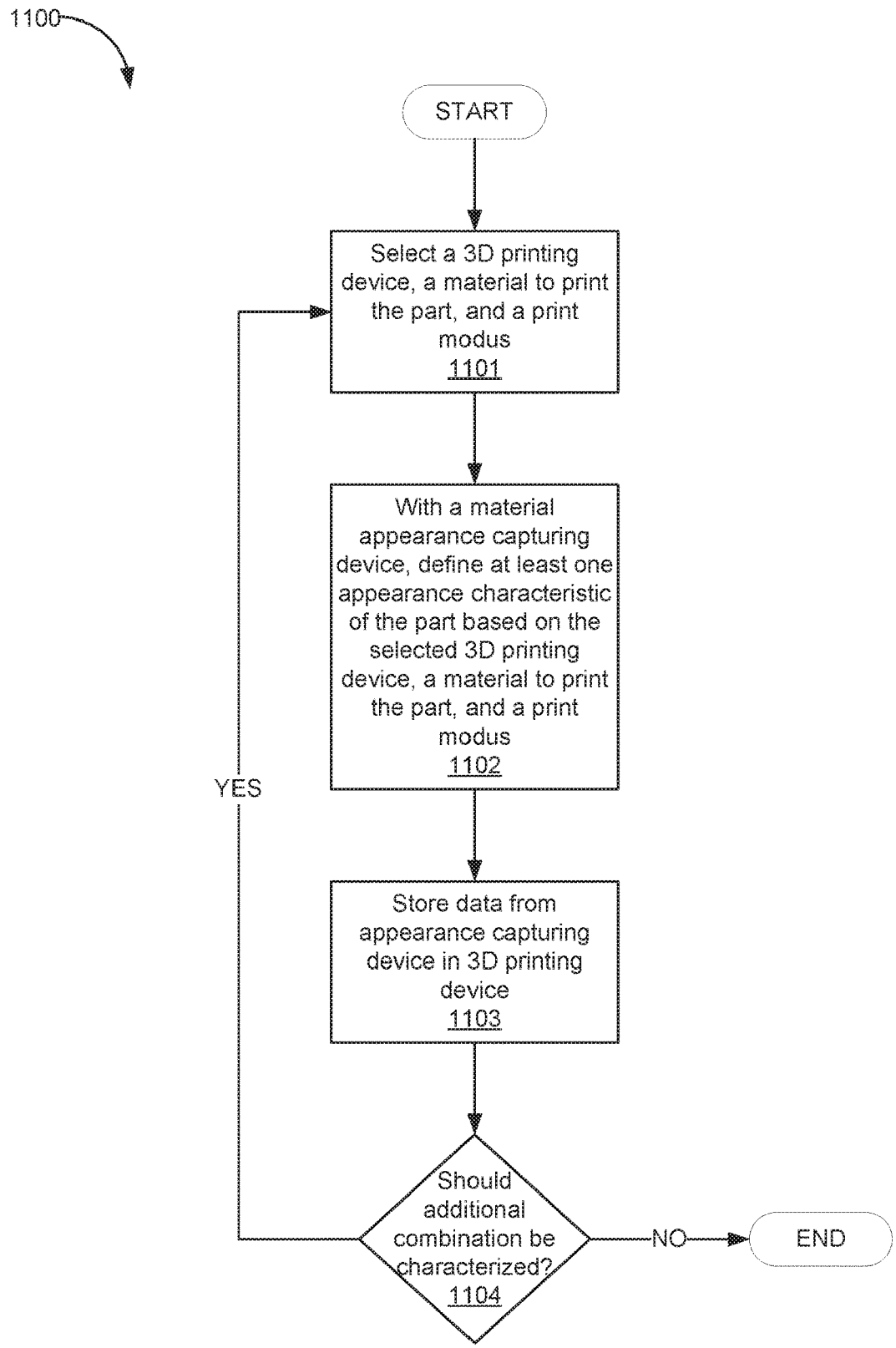
FIG. 11 is a flowchart showing a method of obtaining data from a material appearance capturing device, according to an example of the principles described herein.

FIG. 11 is a flowchart showing a method (1100) of obtaining data from a material appearance capturing device (180), according to an example of the principles described herein. The method (1100) of FIG. 11 may include selecting (block 1101) a 3D printing device (200), a material from which to print the part that the 3D printing device (200) may offer as a printable material, and a print modus that the 3D printing device (200) may use to print the part. Selecting (block 1101) these parameters allows for a particular appearance of the material to be captured.

With the material appearance capturing device (180), at least one appearance characteristic of the part (503) may be defined (block 1102). In one example, the at least one appearance characteristic of the part (503) may be defined (block 1003) based on the selected 3D printing device (200), a material from which to print the part that the 3D printing device (200) may offer as a printable material, and a print modus that the 3D printing device (200) may use to print the part obtained at block 1003. Data obtained from the material appearance capturing device (180) may be stored (block 1103) in a data storage device (102) of the 3D printing device (200) or another data storage device such as a database accessible by the computing device (100), the 3D printing device (200), a server, or any other device. Further, this data may be made available to users of a 3D printing device (200) as the user is seeking to print parts with various material characteristics.

It may be determined (block 1104) whether additional combinations of a selected 3D printing device (200), a material from which to print the part that the 3D printing device (200) may offer as a printable material, and a print modus that the 3D printing device (200) may use to print the part should be characterized. Since there are many different combinations of the 3D printing devices, printing materials, and print modus, the appearances of the resulting objects captured by the material appearance capturing device (180) may widely differ. In response to a determination that there are additional combinations of selected 3D printing devices (200), printing materials, and print modus to be characterized (block 1104, determination YES), then the method (1100) may loop back to block 1101 to perform such a characterization. As there are many different combinations of 3D printing devices (200), and print modus to be characterized (block 1104) that may be characterized, the material appearance capturing device (180) may capture all of these and store data defining these combinations.

In response to a determination that there are no additional combinations of selected 3D printing devices (200), printing materials, and print modus to be characterized (block 1104, determination NO), then the method (1000) may terminate. With this data produced by the material appearance capturing device (180), images of the part may be soft-proofed by the computing device (100).

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer; special purpose computer, or other programmable data processing apparatus to produce a machine; such that the computer usable program code, when executed via, for example, the processor (101) of the computing device (100) or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example; the computer readable storage medium is a non-transitory computer readable medium.

The specification and figures describe a system for presenting a soft-proof of a three-dimensional (3D) printed part. The system may include a processor, and a memory device communicatively coupled to the processor. The system may also include a communication link to support communication with a 3D printing device, and computer usable program code to, when executed by the processor, retrieve data from the 3D printing device defining at least one capability of the 3D printing device that affects an appearance of a part when printed. The system may also include an application programming interface (API) to provide data defining generation of a soft-proof of the part based on the at least one capability of the 3D printing device, the soft-proof of the part depicting characteristics of the part as the part appears as printed.

The examples described herein enable a 3D object design application to generate an accurate and holistic 3D printed part preview which covers both appearance attributes in great depth and mechanical attributes. The provision of data through an API from a 3D printing device allows for the provision of such data once from which many applications may fetch the data from the 3D printing device providing scalability of the systems and methods described herein. Further, the provision of data through an API from a 3D printing device allows for the applications to use either the complete data set obtained from the 3D printing device or parts of it. Further, information in many different forms suitable for the different applications may be provided in a universal format suitable for a wide variety of applications, Still further, immediate updates to the capability data obtained from the 3D printing device may be fetched in real time including, for example, an ICC profile, to where all users may potentially receive the latest profile immediately.

If new materials or printing modes are added, then the system may simply and effectively add additional information to the 3D printing device for dissemination to the computing device. Further, the whole system is geared towards a 3D printing device that focuses both on material appearance and mechanical attributes. Still further, scalability is possible both from the 3D printing device's side as to what types of data are provided, and from the point of view of the applications running on the computing device (100) as to which information the computing device (100) is using and how the computing device (100) is using the information. Further, the examples described herein are set up to take advantage of the syntax of the new ICC profile specification and color management modules (CMMs) that are being developed.

The preceding description has been presented to illustrate and describe examples of the principles described. This description is not intended to be exhaustive or to limit these principles to any precise form disclosed, Many modifications and variations are possible in light of the above teaching.

What is claimed is:

1. A method of presenting a soft-proof of a three-dimensional (3D) printed part, comprising:
   loading a 3D designed part;
   retrieving data from a 3D printing device defining at least one capability of the 3D printing device that affects an appearance of the 3D designed part when printed;
   determining at least one mechanical property of the 3D printed part as printed based on the data from the 3D printing device defining the at least one capability of the 3D printing device; and
   providing data, via an application program interface (API), defining generation of the soft-proof of the 3D designed part based on the at least one capability of the 3D printing device, the soft-proof of the 3D designed part comprising a depiction of characteristics of the 3D designed part as the 3D designed part appears as printed, and the at least one mechanical property of the 3D designed part as printed.

2. The method of claim 1, wherein the characteristics of 3D designed the part as it appears as printed comprise the 3D designed part under a plurality of different light sources, the 3D designed part under a plurality of different illumination conditions, the 3D designed part as viewed at different positions and distances, the 3D designed part with specific diffuse and specular material reflection characteristics, the 3D designed part under different specular colors, the glossiness of the 3D designed part based on the printing material, the printing conditions, at least one texture of at least one portion of the 3D designed part, the opacity of the 3D designed part, the effects of at least one post-print process applied to the 3D designed part, at least one mechanical property of the 3D designed part, or combinations thereof.

3. The method of claim 1, wherein generating the soft-proof comprises presenting the soft-proof within a computer aided design (CAD) computer program.

4. The method of claim 1, comprising:
identifying at least one post printing process capability of the 3D printing device,
wherein generating the soft-proof comprises generating the soft-proof of the 3D designed part based on the at least one post printing process capability of the 3D printing device, the soft-proof of the 3D designed part depicting characteristics of the 3D designed part as it appears after at least one post printing process.

5. The method of claim 1, wherein the characteristics of the 3D designed part as it appears as printed are obtained by a material appearance capturing device and stored as data within a data storage device.

6. The method of claim 1, comprising conveying an indication of appearance differences between the design of the 3D designed part and the 3D designed part as it appears as printed,
wherein the appearance differences between the design of the 3D designed part and the 3D designed part as it appears as printed comprise which colors are outside a color gamut of the 3D printing device, appearance differences resulting from material changes, appearance differences resulting from print mode changes, appearance differences resulting from application of post processing, appearance differences regarding colors in the 3D designed part as it appears as printed where the naming boundaries of the colors are crossed, appearance differences regarding areas on the 3D designed part as it appears as printed where the colors or surface appearance would change by applying a specific post-processing technique, appearance differences regarding different materials used to print the 3D designed part, or combinations thereof.

7. The method of claim 1, comprising:
via the API, add the at least one mechanical property to the data defining the generation of the soft-proof of the 3D designed part.

8. The method of claim 1, wherein the at least one mechanical property comprises mechanical strength of the 3D designed part, minimum feature sizes of the 3D designed part, weak points within the construction of the 3D designed part, or combinations thereof.

9. The method of claim 1, further comprising:
obtaining metadata regarding the at least one mechanical property of the 3D printed part; and
providing the metadata to the API to render the soft-proof of the 3D designed part indicating the at least one mechanical property of the 3D printed part.

10. The method of claim 1, further comprising displaying an infographic view of the at least one mechanical property of the 3D printed part.

11. The method of claim 10, wherein the infographic view shows differences in strength of a number of portions of the 3D designed part, a difference in strength between printing the 3D designed part with two different materials, or combinations thereof.

12. The method of claim 1, wherein the characteristics of the 3D designed part as it appears as printed comprise characteristics of the 3D designed part that are depicted within a computer aided design (CAD) but are not accurately realized in the 3D designed part as printed.

13. A system for presenting a soft-proof of a three-dimensional (3D) printed part, comprising:
a processor;
a memory device communicatively coupled to the processor;
a communication link to support communication with a 3D printing device;
computer usable program code to, when executed by the processor, retrieve data from the 3D printing device defining at least one capability of the 3D printing device that affects an appearance of a part when printed; and
an application programming interface (API) to provide data defining generation of a soft-proof of the part based on the at least one capability of the 3D printing device, the soft-proof of the part depicting differences between a design of the part and the appearance of the part as printed.

14. The system of claim 13, wherein the API comprises an indicator to convey an indication of appearance differences between the design of the part as presented in a computer aided design (CAD) computer program and the part as it appears as printed.

15. The system of claim 14, wherein the appearance differences between the design of the part as presented in the CAD computer program and the part as it appears as printed comprise which colors are outside a color gamut of the 3D printing device, appearance differences resulting from material changes, appearance differences resulting from print mode changes, appearance differences resulting from application of post processing, appearance differences regarding colors in the part as it appears as printed where the naming boundaries of the colors are crossed, appearance differences regarding areas on the part as it appears as printed where the colors or surface appearance would change by applying a specific post-processing technique, appearance differences regarding different materials used to print the part, or combinations thereof.

16. The system of claim 13, wherein the API comprises an indicator to convey an indication of the at least one capability of the 3D printing device.

17. A non-transitory computer program product for displaying a three-dimensional (3D) soft-proof, the computer program product comprising:
a computer readable storage medium comprising computer usable program code embodied therewith, the computer usable program code to, when executed by a processor:
retrieve data from a 3D printing device defining at least one capability of the 3D printing device that affects an appearance of a 3D designed part when printed;
generate a soft-proof of the 3D designed part based on the at least one capability of the 3D printing device, the soft-proof of the 3D designed part comprising a depiction of characteristics of the 3D designed part as the 3D designed part appears as printed; and convey an indication of appearance differences between the soft-proof as presented and the 3D designed part as the 3D designed part appears as printed.

18. The computer program product of claim 17, wherein the computer program product is a portion of a three-dimensional (3D) design computer program.

19. The computer program product of claim 17, wherein the appearance differences between the design of the 3D designed part and the 3D designed part as it appears as printed comprise which colors are outside a color gamut of the 3D printing device, appearance differences resulting from material changes, appearance differences resulting from print mode changes, appearance differences resulting from application of post processing, appearance differences regarding colors in the 3D designed part as it appears as printed where the naming boundaries of the colors are crossed, appearance differences regarding areas on the 3D designed part as it appears as printed where the colors or surface appearance would change by applying a specific post-processing technique, appearance differences regarding different materials used to print the 3D designed part, or combinations thereof.

20. The computer program product of claim 17, comprising computer usable program code to, when executed by the processor, to display characteristics of the 3D designed part as it appears as printed based on material appearances as obtained from a capturing device.

\* \* \* \* \*